United States Patent [19]
Tyburn et al.

[11] Patent Number: 5,442,291
[45] Date of Patent: Aug. 15, 1995

[54] COMMUTATION DEVICE AND CONTROL PROCESS USING THE SAME

[75] Inventors: Jean-Max Tyburn, Wissembourg; Alfred Niess, Hunspach, both of France; Tonio Gianotti, Heidelberg, Germany

[73] Assignee: Sadis Bruker Spectrospin Societe Anonyme De Diffusion De L'Instrumentation Scientifique Bruker Spectrospin (Societe Anonyme a Directoire), Wissembourg, France

[21] Appl. No.: 152,026

[22] Filed: Nov. 15, 1993

[30] Foreign Application Priority Data

Nov. 16, 1992 [FR] France .................................. 92 13880

[51] Int. Cl.⁶ ............................................. G01V 3/00
[52] U.S. Cl. ...................................... 324/322; 324/318
[58] Field of Search ............... 324/300, 303, 307, 309, 324/314, 318, 319, 322

[56] References Cited

U.S. PATENT DOCUMENTS 4,628,264 12/1986 Rzedzian ............................ 324/322
5,285,161 2/1994 Rzedzian et al. ................... 324/322
5,298,863 3/1994 Nowak et al. ...................... 324/322

*Primary Examiner*—Louis Arana
*Attorney, Agent, or Firm*—Young & Thompson

[57] ABSTRACT

Commutation device to connect and disconnect a current or voltage generator and a coil adapted to create a gradient of magnetic field in a measurement chamber of an NMR apparatus. The device comprises a switch (1) mounted in the supply circuit (2) of the coil (3), actuated by a control signal and adapted, in open position, to isolate totally the coil (3) from the generator (4). The switch is a double switch (1) adapted to separate, upon opening, the supply circuit (2) into a portion (5) connected to the generator (4) and a portion (6) connected to the coil (3), independently of each other. Alternatively the switch can be a high speed switch comprising at least one field effect transistor. The process for controlling the action of the coil comprises, at the end of an excitation phase and just before a measurement phase, sending an opening signal to the switch (1) so as to disconnect and to isolate from each other the generator (4) and the coil (3) and then, after a predetermined time lag, to trigger a measurement phase.

4 Claims, 1 Drawing Sheet

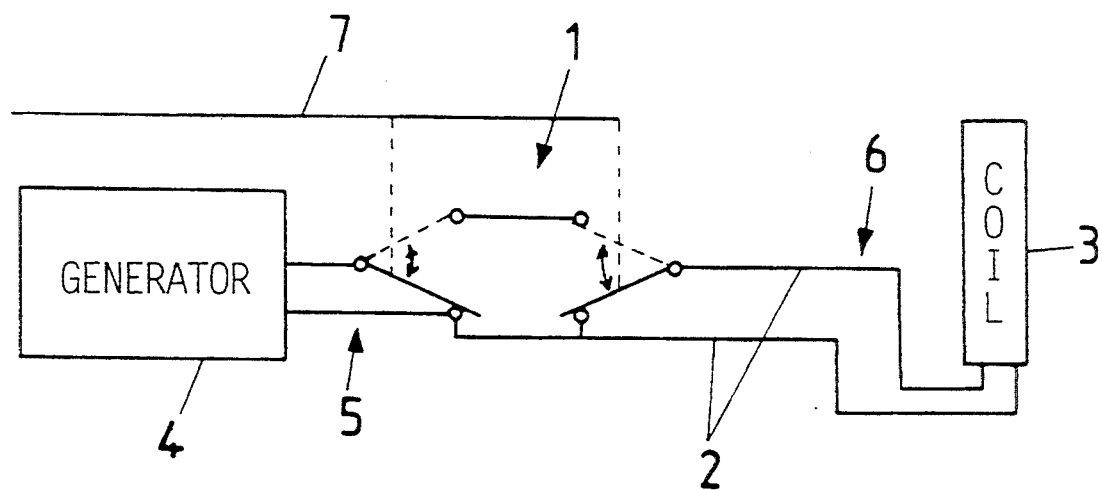

COMMUTATION DEVICE AND CONTROL PROCESS USING THE SAME

BACKGROUND OF THE INVENTION

1. Field of the Invention

The present invention relates to the field of nuclear magnetic resonance (NMR) apparatus, utilized particularly for medical imaging or for high resolution NMR microimaging, and has for its object a commutation device, as well as a control process using said device.

2. Description of the Related Art

At present, new high resolution NMR tests require the generation of high intensity field gradients, namely of about 100 Gauss/cm.

Moreover, the observation of spectra with a high resolution, for example less than 0.2 Hz for principal field B1 of 14.6 Tesla and a proton resonance frequency of 600 MHz, requires the generation of local field correction gradients, by means for example of a high resolution NMR spectrometer, of correction coils, also called "shim" coils.

The typical maximum value of these local field corrections is about 10 mGauss and the sensitivity of the shim in one direction, such as the Z direction, is about 10 $\mu$Gauss.

As a result, the relationship between the field gradient necessary for the high resolution tests and the smallest gradient influencing the field is from 100 Gauss/1 $\mu$Gauss or $10^8$.

Moreover, the value of the current delivered by the output amplifier of the generator supplying the coil adapted to create the field gradient of 100 Gauss/cm is about 10A.

It is therefore necessary, in order to avoid undesirable disturbances of the local field, that the generator have, at the level of its output amplifier, a stability greater than 10 A/$10^8$ that is, 0.1 $\mu$A.

Such a stability cannot be achieved at present by conventional electronic means.

SUMMARY OF THE INVENTION

The problem solved by the present invention therefore consists in providing a simple and low cost device to eliminate the influence of output noise of a generator supplying a coil for generation of high value gradients on the stability of the magnetic field of a magnet of an NMR apparatus, during the phases of measurement of an NMR test.

This problem is solved by the invention thanks to the commutation device to connect and disconnect a current or voltage generator and a coil adapted to create a gradient of magnetic field in the measurement chamber of an NMR apparatus, characterized in that it is in the form of switch means mounted in the supply circuit of the coil, actuated by means of a control signal and adapted, in open position, to isolate totally the coil of the generator.

The invention also has for its object a process for controlling the action of a coil adapted to create a magnetic field gradient and supplied by a generator, using the commutation device described above, characterized in that it consists, at the end of the excitation phase and just before the measurement phase, in sending an opening signal to the commutation device so as to disconnect and isolate from each other the generator and the coil, and then, after a predetermined time period, to trigger the measurement phase.

BRIEF DESCRIPTION OF THE DRAWINGS

The invention will be better understood from the following description, which relates to a preferred embodiment, given by way of non-limiting example, and explained with reference to the accompanying drawing whose single FIGURE represents schematically a supply circuit comprising the commutation device according to the invention.

DESCRIPTION OF THE PREFERRED EMBODIMENTS

As shown in this figure of the accompanying drawing, the commutation is present in the form of switch means 1 mounted in the supply circuit 2 of the coil 3, actuated by means of a control signal and adapted, in the open position, to isolate totally the coil 3 from the generator 4.

According to a preferred embodiment of the invention, the commutation device is present in the form of a double switch 1 that can divide, upon opening, the supply circuit 2 into a portion 5 connected to the generator 4 and a portion 6 connected to the coil 3, independently of each other.

When the double switch 1, if desired constituted by the assembly of two simple switches in series, is controlled to open by means of a control line 7, it shunts, as a result, the generator 4 and the coil 3, thereby isolating completely these two elements.

According to another characteristic of the invention, the commutation device 1 can preferably consist of a high speed switch comprising at least one field effect transistor, permitting obtaining the very short reaction times necessary to pass effectively from the excitation phase to the measurement phase in the NMR apparatus.

The invention also has for its object a control process for the action of a coil 3 adapted to create a magnetic field gradient, particularly of high value, and supplied by a generator 4 of current or voltage, using the commutation device 1 described above.

This process consists essentially, at the end of the excitation phase and just before the measurement phase, in sending an opening signal to the commutation device 1 so as to disconnect and to isolate from each other the generator 4 and the coil 3, and then, after a predetermined time lapse, to trigger the measurement phase.

Of course, the invention is not limited to the embodiment described and shown in the accompanying drawing. Modifications remain possible, particularly as to the construction of the various elements, or by substitution of technical equivalents, without thereby departing from the scope of protection of the invention.

What is claimed is:

1. Commutation device to connect and disconnect a current or voltage generator and a coil adapted to create a gradient of magnetic field in a measurement chamber of an NMR apparatus, comprising switch means (1) mounted in the supply circuit (2) of the coil (3) and actuated by means of a control signal, said switch means (1) being configured to totally isolate the coil (3) from the generator (4) when said switch means (1) is controlled to assume an open position to thereby trigger a measurement phase of said NMR apparatus.

2. Device according to claim 1, comprising a double switch (1) adapted to separate, upon opening, the supply circuit (2) into a portion (5) connected to the generator (4) and a portion (6) connected to the coil (3), independently of each other.

3. Device according to claim 1, wherein said switch means is at least one high speed field effect transistor.

4. Process for controlling the action of a coil adapted to create a magnetic field gradient and supplied by a current or voltage generator, comprising, at the end of an excitation phase and just before a measurement phase, sending an opening signal to a switch (1) so as to disconnect and to isolate from each other a generator (4) and a coil (3) and then, after a predetermined time lag, to trigger a measurement phase.

* * * * *